(12) United States Patent
Terasaki

(10) Patent No.: US 10,464,325 B2
(45) Date of Patent: Nov. 5, 2019

(54) METHOD FOR PROCESSING SILICON SUBSTRATE AND METHOD FOR MANUFACTURING LIQUID EJECTION HEAD

(71) Applicant: CANON KABUSHIKI KAISHA, Tokyo (JP)

(72) Inventor: Atsunori Terasaki, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 114 days.

(21) Appl. No.: 15/464,903

(22) Filed: Mar. 21, 2017

(65) Prior Publication Data
US 2017/0274658 A1 Sep. 28, 2017

(30) Foreign Application Priority Data

Mar. 24, 2016 (JP) .................................. 2016-059813

(51) Int. Cl.
| | |
|---|---|
| *B41J 2/16* | (2006.01) |
| *B41J 2/045* | (2006.01) |
| *B41J 2/14* | (2006.01) |
| *B81C 1/00* | (2006.01) |

(52) U.S. Cl.
CPC ........... *B41J 2/1601* (2013.01); *B41J 2/0458* (2013.01); *B41J 2/14032* (2013.01); *B41J 2/162* (2013.01); *B41J 2/1603* (2013.01); *B41J 2/164* (2013.01); *B41J 2/1628* (2013.01); *B41J 2/1629* (2013.01); *B41J 2/1631* (2013.01); *B81C 1/00206* (2013.01); *B81C 1/00619* (2013.01); *B41J 2002/14467* (2013.01); *B41J 2202/22* (2013.01); *B81B 2201/052* (2013.01); *B81B 2203/0353* (2013.01); *B81C 2201/014* (2013.01); *B81C 2201/0132* (2013.01)

(58) Field of Classification Search
CPC .......... H01L 21/76802; H01L 21/0334; H01L 21/31116; H01L 21/76898
See application file for complete search history.

(56) References Cited

U.S. PATENT DOCUMENTS

| | | | |
|---|---|---|---|
| 6,534,247 B2 | 3/2003 | Milligan | |
| 2014/0227875 A1* | 8/2014 | Hacker | ............. H01L 21/76802 438/675 |
| 2015/0243524 A1* | 8/2015 | Kihara | ............. H01L 21/31144 438/694 |

* cited by examiner

*Primary Examiner* — Mohammed R Alam
(74) *Attorney, Agent, or Firm* — Canon USA, Inc., IP Division

(57) ABSTRACT

A method for processing a silicon substrate includes forming a structure having a bottom surface and a depth of 200 μm or more or 300 μm or more from a first surface of a silicon substrate, forming a protective film on an inner wall of the structure, and performing plasma etching so as to selectively remove the protective film disposed on the bottom surface of the structure with respect to the protective film disposed on the substantially perpendicular side wall of the structure, wherein the plasma etching is performed under the condition in which plasma with a sheath length at least 10 times the depth when the depth is 200 μm or more, or at least 5 time the depth when the depth is 300 μm or more, is generated and a mean free path of ions generated in the plasma is longer than the sheath length.

20 Claims, 9 Drawing Sheets

| d | q |
|---|---|
| 1 | 1.00 |
| 2 | 0.63 |
| 3 | 0.48 |
| 4 | 0.40 |
| 5 | 0.34 |
| 6 | 0.30 |
| 7 | 0.27 |
| 8 | 0.25 |
| 9 | 0.23 |
| 10 | 0.22 |
| 20 | 0.14 |
| 40 | 0.09 |

METHOD FOR PROCESSING SILICON SUBSTRATE AND METHOD FOR MANUFACTURING LIQUID EJECTION HEAD

BACKGROUND OF THE INVENTION

Field of the Invention

The present disclosure relates to a method for processing a silicon substrate and a method for manufacturing a liquid ejection head.

Description of the Related Art

In common processing of micro electro mechanical systems (MEMS) and processing of some semiconductor devices, there are many examples of processing of structures that penetrate silicon substrates or have depths almost equal to the depths of the silicon substrates. In order to protect the walls of the structures from coming into contact with chemical agents and the like during production and use and to electrically insulate the structures, some protective films may be formed and protective films for the bottom section may be removed for the purpose of enabling communication with devices disposed on the bottom surface side of the structures. Examples of such structures include a supply port of a liquid ejection head and a penetrating electrode of a penetrating wiring substrate. Hereafter a liquid ejection head will be mainly described below in detail as an example thereof.

At present, a silicon substrate used for the liquid ejection head is processed by applying a semiconductor device microfabrication technology. In a common liquid ejection head used for a liquid ejection printing system, a flow passage forming member is disposed on the silicon substrate.

The flow passage forming member forms an ejection port for ejecting liquid droplets and a liquid flow passage that communicates with the ejection port. In general, a plurality of liquid flow passages are arranged in a line. Ejection energy generation elements are disposed in a portion of the liquid flow passage on the silicon substrate, and liquid droplets are ejected from the ejection ports due to the energy generated by the ejection energy generation elements. The silicon substrate is provided with a plurality of supply ports that communicate with the respective liquid flow passages and a common liquid chamber that communicates with the supply ports.

In such a configuration, droplets are ejected from the ejection ports by, for example, heating and foaming a liquid by using thermal energy from the ejection energy generation elements, e.g., ejection heaters or the like. At that time, the liquid is supplied from the supply ports to the liquid flow passages and the liquid is supplied from the common liquid chamber to the supply ports.

Examples of methods for processing a silicon substrate used for such a liquid ejection head include a method involving two-stage etching of a silicon substrate, as described in U.S. Pat. No. 6,534,247. In this method, first etching is performed by employing crystal anisotropic etching so as to form a common liquid chamber. Then, second etching is performed by employing dry etching so as to form supply ports. According to this method, the silicon substrate is provided with the common liquid chamber and the supply ports that communicate with the common liquid chamber, and a structure penetrating the silicon substrate by combining the common liquid chamber and the supply ports is formed.

In general, silicon is etched by an alkaline solution. In the case where an alkaline liquid is ejected, the inner wall of the structure is dissolved, and the dimension of an opening may be changed. In particular, the wall of each of the supply ports described in U.S. Pat. No. 6,534,247 has low alkali resistance compared with the wall of the common liquid chamber formed by crystal anisotropic etching and, therefore, the above-described problem becomes significant. Consequently, a film (hereafter referred to as a protective film) is formed for protecting the wall, at which silicon is exposed, from an alkaline solution.

In many cases, the protective film is formed from the opening side of the structure of the liquid ejection head. The protective film is formed on the upper surface of the silicon substrate and the side wall of the structure. A flow passage forming member for demarcating the liquid flow passage and ejection ports may be formed on a second surface opposite to a first surface, on which the common liquid chamber and the supply ports are formed, of the silicon substrate. In that case, an etching stop layer or the like is disposed on the second surface of the silicon substrate such that the flow passage forming member is not affected during dry etching of the supply ports. Therefore, the protective film is also disposed on the bottom surface of the structure. However, it is necessary that only the protective film disposed on the bottom surface of the supply port be removed for the purpose of enabling communication with the ejection port side.

In general, dry etching is used for removing the protective film on the bottom surface. This is because the protective film on a horizontal surface is selectively removed and the protective film on a perpendicular surface is retained by introducing ions having directional properties.

Nowadays the same technique is also used for a through silicon via (TSV) which is discussed in a semiconductor production process. TSV is used to establish a connection with a wiring line on a back surface by forming a through hole in a silicon substrate provided with a semiconductor element. A protective film composed of an insulator is formed on a side surface of the TSV so as to electrically insulate the silicon substrate from the TSV. In this case as well, another device is present on the bottom surface of the through hole, a protective film is formed on the bottom surface of the through hole and, therefore, the protective film has to be removed.

SUMMARY OF THE INVENTION

The present disclosure provides a method for processing a silicon substrate including forming a structure having a depth of 200 μm or more from a first surface of a silicon substrate, a side wall, and a bottom surface, at least a part of the side wall being substantially perpendicular to the first surface, forming a protective film on an inner wall of the structure, and performing plasma etching so as to selectively remove the protective film disposed on the bottom surface of the structure with respect to the protective film disposed on the substantially perpendicular side wall of the structure, wherein the plasma etching is performed under the condition in which plasma with a sheath length at least 10 times the depth of the structure is generated and a mean free path of ions generated in the plasma is equal to or longer than the sheath length.

The present disclosure provides a method for processing a silicon substrate including forming a structure having a depth of 300 μm or more from a first surface of a silicon substrate, a side wall, and a bottom surface, at least a part of the side wall being substantially perpendicular to the first surface, forming a protective film on an inner wall of the structure, and performing plasma etching so as to selectively remove the protective film disposed on the bottom surface of the structure at least without damaging the protective film disposed on a substantially perpendicular side wall of the structure, wherein the plasma etching is performed under the condition in which plasma with a sheath length at least 5 times the depth of the structure is generated and a mean free path of ions generated in the plasma is equal to or longer than the sheath length.

Further features of the present disclosure will become apparent from the following description of exemplary embodiments with reference to the attached drawings.

DESCRIPTION OF THE EMBODIMENTS

In a common dry etching process, tracks of all ions are not always ideally perpendicular to a substrate surface. This is because in plasma, ions move in every direction with the same likelihood and when ions are attracted into the substrate, ions are accelerated while the directions thereof are made to be substantially the same, although velocity components in directions different from the direction of acceleration remain. Consequently, ions accelerated in the direction toward the substrate have angle deflections to some extent.

In the case where the structure that is a target of removal of a protective film on the bottom surface meets any one or both of the following conditions,
(1) the depth is very large such that, for example, a silicon wafer is penetrated, and
(2) the aspect ratio is very large,
the proportion of ions that collide with the side wall increases to a great extent. Therefore, the proportion of ions that contribute to removal of the protective film on the bottom surface decreases. On the other hand, damage is accumulated in the protective film on the side wall. As a result, in the case where an alkaline liquid is made to flow, part of the side wall may be corroded or the insulation property of the protective film may be impaired.

Regarding the above-described structure, it is difficult to reduce ion bombardment of the side wall under normal etching conditions. The present invention provides a process design concept such that a protective film of a side wall, in particular, a substantially perpendicular side wall, is not damaged during removal of the protective film on the bottom surface, among the protective films formed on the inner wall, in a structure having a very large depth and a high aspect ratio.

Embodiments

Figure 1:
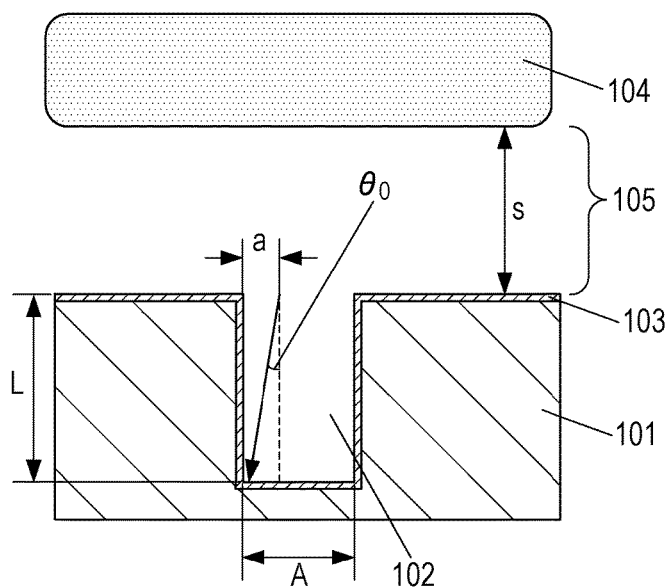
FIG. 1 is a conceptual schematic diagram in accordance with aspects of exemplary embodiments.

In the present disclosure, as shown in FIG. 1, a protective film 103 is formed on an inner wall of a structure 102 in the depth direction, such as a hole or a trench, having a bottom surface in a silicon substrate 101. Then, a process design concept is provided so as not to damage the protective film on a side wall during selective removal of the protective film on the bottom surface of the structure with respect to the protective film on the substantially perpendicular side wall of the structure by plasma etching.

In the case where etching is performed by using plasma, a region called a plasma sheath (or sheath simply) is usually formed, where a substrate surface is an equipotential surface. In this sheath, a negative potential difference is generated with reference to the plasma and, thereby, ions that move from the plasma toward the substrate through the sheath are accelerated. Therefore, ions are accelerated perpendicularly to the equipotential surface of the sheath, that is, perpendicularly toward the substrate. Further, in the case where a bias power is applied to the substrate, the negative potential of the substrate is enhanced, and energy for attracting ions increases. Reactive ion etching is based on this.

One aspect of the present disclosure is a concept of providing a sheath having a distance sufficient for accelerating ions and making the directions of traces of ions the same as long as possible. It is ideal to complete removal of the protective film on the bottom surface, before damage is accumulated, by reducing the proportion of ions that collide with the side wall. This may be specified to some extent by a correlation between the length of the sheath and the depth of the structure.

As shown in FIG. 1, the length of the sheath refers to a length (s) of a straight line that connects the surface of the substrate 101 and the plasma 104 at the shortest distance. The length of the sheath (hereafter referred to as sheath length (s)) is calculated on the basis of the following formula (1-1) called Child-Law.

$$s(\text{sheath length}) = \frac{\sqrt{2}}{3}\lambda_D\left(\frac{2V_0}{T_e}\right)^{3/4} \quad (1\text{-}1)$$

$$\lambda_D(\text{Debye length}) = \left(\frac{\varepsilon_0 T_e}{n_0 e}\right)^{1/2} \quad (1\text{-}2)$$

e: elementary charge=1.60217653E-19 (C)
$\varepsilon_0$: permittivity of vacuum=8.85418782E-12 (F/m)
$T_e$: electron temperature (eV)
$V_0$: direct current potential difference applied to sheath (V)
$n_0$: electron density (m$^{-3}$)

Angle deflection ($\theta_0$) of an ion incident on the substrate is represented by the formula below.

$$\theta_0 = \arctan(kTi/eV_0)^{1/2} \quad (2)$$

Ti: ion temperature (K)
k: Boltzmann constant=1.38E-23 (J/K)

As shown in FIG. 1, the depth of the structure 102 (pattern depth) is specified as L (µm) and the dimension of the opening (opening width) is specified as A (µm). It is assumed that the density of ions incident on the opening face is equal at every position and there is a likelihood of collision of ions with the side wall, the ions being incident on the space between the edge and the location at a distance a (μm) from the edge of the opening. That is, it is interpreted that as the value of a increases, the number of ions that collide with the side wall increases. Under the above-described assumption, a is represented by the following formula.

$$a = L \tan \theta_0 \quad (3\text{-}1)$$

Under the assumption that $\theta_0$ is sufficiently small, an approximates formula (3-2) below on the basis of formula (3-1) and formula (2).

$$a \approx L(kT_e/eV_0)^{1/2} \quad (3\text{-}2)$$

Accordingly, the relationship represented by formula (4-1) below is derived.

$$a \propto V_0^{-1/2} \quad (4\text{-}1)$$

Substitution of formula (1-1) and formula (1-2) into formula (3-2) yields the following relationship.

$$a \propto s^{-2/3} \quad (4\text{-}2)$$

Assuming that the proportion of a in the opening width A is p, the following formula is derived by using formula (3-2).

$$p = a/A \propto L/A \quad (5)$$

In this regard, L/A is a ratio of pattern depth/opening width, that is, the aspect ratio.

Accordingly, it is understood that the number of ions that collide with the side wall is proportional to the direct current potential difference applied to the sheath to the power of $-\frac{1}{2}$, the sheath length to the power of $-\frac{2}{3}$, and the aspect ratio. The correlation between the direct current potential difference applied to the sheath and the sheath length is represented by formula (1-1) and, therefore, discussions may be performed on the basis of the parameter of any one of them.

However, the aspect ratio and the sheath length are different from each other in the manner of contribution to the number of ions that collide with the side wall. Formula (5) indicates that the number of ions that reach the bottom surface decreases as the aspect ratio increases. Consequently, removal of the protective film on the bottom surface takes much time and, as a result, the number of ions that collide with the side wall increases. Meanwhile, geometric parameters, e.g., traces and acceleration energy of ions that collide with the side wall, are determined by the sheath length and are not dependent on the aspect ratio. In the discussion here, first, the aspect ratio is set to be constant, and the variable is set to be the sheath length.

Figure 2:
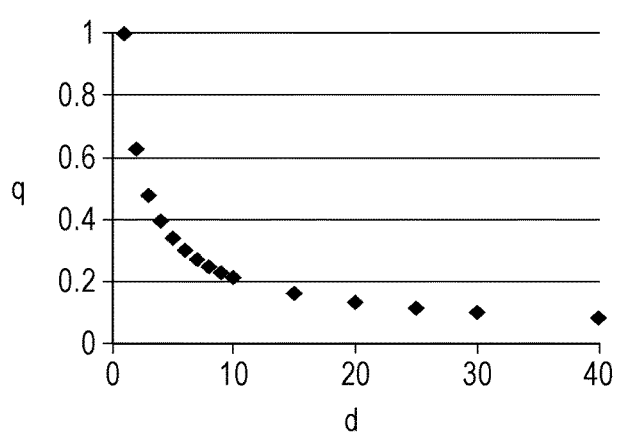
FIG. 2 is a diagram showing the correlation between variables in accordance with aspects of exemplary embodiments.

In the case where a variable normalized so as to become 1 when the sheath length is equal to the depth of the structure is set to be d and a variable similarly normalized such that p (refer to formula (5)) becomes 1 is set to be q, the relationship between d and q is shown in FIG. 2. It is possible to interpret q as a variable that approximately represents changes in accordance with normalization of the number of ions that collide with the side wall to 1 in the case where the sheath length is equal to the depth of the structure.

As is clear from FIG. 2, the value of q sharply decreases by a factor of about 3 when the sheath length increases to about 5 times the depth of the structure, decreases by a factor of about 5 when the sheath length increases to 10 times the depth of the structure, and thereafter, the change is very mild when the sheath length further increases. It is considered from this result that a region in which the sheath length is at least 5 times the depth of the structure, and preferably at least 10 times, is an effective requirement for reducing damage to the side wall due to ions.

Next, the correlation between ions is considered. Even in the case where one ion is substantially perpendicularly incident on a substrate, if collision with another ion occurs before the substrate is reached, the direction may be changed and the side wall may be damaged. However, this situation does not occur if a condition, under which the ion does not collide with another ion during acceleration in the sheath, is realized.

The distance, in which one particle moves until collision with another particle occurs, is referred to as a mean free path. The mean free path ($\lambda$) of ions generated in plasma is represented by formula (6) below.

$$\lambda = \frac{kT_i}{4\sqrt{2} \times \pi r^2 \times P} \quad (6)$$

k: Boltzmann constant=1.38E-23 (J/K)
$T_i$: ion temperature (K)
r: collision radius (m)
P: pressure (Pa)

In general, values of $T_i$ and r do not fluctuate to a great extent depending on the condition. Therefore, $\lambda$ is proportional to the reciprocal of P. For example, under the assumption that $T_i$=400 K and r=2.0E-10 m, which are typical values of Ar plasma, approximation is made as described below.

$$\lambda = 7.77/P \text{ (mm)} \quad (7)$$

In the case where the value of $\lambda$ is more than or equal to the sheath length, collisions of ions do not occur in the sheath.

Physical quantities of an actual, typical plasma etching system are roughly calculated on the basis of these formulae. The sheath length is estimated to be about 14 mm by substituting electron temperature (Te)=2.0 eV, electron density ($n_0$)=1.0E16 (m$^{-3}$), and direct current potential difference applied to sheath ($V_0$)=2,000 V, which are typical values of a parallel plate type etching system, into formula (1-1). In consideration of the thickness of a wafer falling within 1 mm, a requirement that the sheath length is at least 5 times the depth of the structure is satisfied. On the other hand, the pressure of the parallel plate type etching system is 2 Pa or more in general. That is, the mean free path ($\lambda$) results in 3.89 mm or less by calculation. Therefore, the requirement that the mean free path is more than or equal to the sheath length is not satisfied.

Meanwhile, an inductively coupled plasma (ICP) type etching system is considered. The sheath length is estimated to be about 1.3 mm by substituting electron temperature (Te)=1.0 eV, electron density ($n_0$)=1.0E17 (m$^{-3}$), and direct current potential difference applied to sheath ($V_0$)=300 V, which are typical values, into formula (1-1). In this regard, the mean free path ($\lambda$) is estimated to be about 4 to 15 mm by calculation because the pressure range of the ICP type etching system is about 0.5 to 2.0 Pa in general. The requirement that the mean free path is more than or equal to the sheath length is easily satisfied. However, the requirement that the sheath length is at least 5 times the depth of the structure is satisfied by a region in which the depth of the structure is 260 μm or less, and the requirement that the sheath length is at least 10 times the depth of the structure is satisfied by a region in which the depth of the structure is 130 μm or less. These ranges are not commonly applied to a structure having a depth that almost penetrates a wafer.

As described above, an optimal solution of the process applicable to the present use is not found in the conditions commonly employed in common etching systems. Therefore, the solution has to be attained in the region that has been hardly examined. The basic concept is that the sheath length is maximized and the mean free path is larger than the sheath length. Consequently, it is considered that a solution is hardly attained with the parallel plate type etching system in which the pressure is not decreased to a great extent. It is appropriate to change the condition of the ICP type etching system in such a manner that the sheath length is increased. However, the plasma etching system is not limited to the ICP type etching system as long as the pressure is sufficiently decreased, that is, a mean free path more than or equal to the sheath length is attained.

In order to increase the sheath length, there are three methods, that is, a reduction in the electron density ($n_0$), an increase in the direct current potential difference applied to the sheath ($V_0$), and lowering of the electron temperature (Te). Among these, the electron temperature (Te) is not fluctuated by the condition to a great extent in general. Therefore, the targets of adjustment are $n_0$ and $V_0$. There is no clear theoretical equation between $n_0$ and $V_0$, but it is observed that $V_0$ increases as $n_0$ is reduced in general. The reason for this is said that a reduction in the electron density ($n_0$) corresponds to the state in which an electric resistance of the sheath, i.e., between plasma and the substrate, is increased. Replacement of this with a parameter that is input on the system side corresponds to two techniques of reduction in the output (ICP excitation power) of a high-frequency power supply for exciting ICP and an increase in the output (bias power) of a high-frequency power supply for exciting the bias that attracts ions into the substrate.

For example, a value of $V_0$=1,300 V is obtained under the conditions of an ICP excitation power of 200 W, a bias power of 900 W, and a pressure of 0.5 Pa. The electron density ($n_0$) at this time is roughly calculated as 5.0E16 ($m^{-3}$), and the sheath length is 5.7 mm. Consequently, even when the thickness of the wafer is assumed to be 1 mm at maximum, it is exceeded by 5 times. Also, the mean free path is 15 mm and, therefore, the requirement that the mean free path is more than or equal to the sheath length is satisfied.

In general, the ICP type etching system is designed for the purpose of applying as high a power as possible to an ICP antenna so as to generate high-density plasma and is used in the designed region. The suitable condition range is shifted to a great extent from the process range recommended by the supply manufacturer of the system and provided in general. This is because not many applications that require such high $V_0$ are present in the market and, in general, it is important to increase processing speed and, thereby, the option to minimize the ICP excitation power is probably not available.

As described above, in a shallow structure having a depth of less than 100 μm, even when the common process condition is employed, the case where the sheath length is made to be at least 10 times the depth of the structure may automatically fall within the above-described constituent requirements. On the other hand, in the case of a structure deeper than that, the relationship between the sheath length and the depth of the structure and the relationship between the sheath length and the mean free path have to be clearly specified. Therefore, in the present disclosure, the depth of the structure is specified as 200 μm or more in the case where the sheath length is made to be at least 10 times the depth of the structure and is specified as 300 μm or more in the case where the sheath length is made to be at least 5 times the depth of the structure. In particular, a structure having a depth of 500 μm or more is expected to exert very large effects in both cases. The depth refers to a depth in the perpendicular direction. For example, one surface of a silicon substrate is specified as a first surface and the surface on the rear side of the first surface is specified as a second surface. At this time, the depth refers to a depth of the structure in the direction perpendicular to the first surface and in the direction toward the second surface. In this regard, the structure has a surface substantially perpendicular to the first surface. "Substantially perpendicular" refers to being inclined 90°±5° relative to the first surface.

Finally, the influence of the aspect ratio is considered. As described above, if the aspect ratio increases, the number of ions that reach the bottom surface of the structure decreases, removal of the protective film on the bottom surface takes much time and, as a result, the number of ions that collide with the side wall increases. In a system in which only incident ions are assumed, ions incident on the outermost surface of the substrate and ions, which are incident on a region out of a in FIG. 1 and which reach the bottom surface of the structure should have the same etching yield, although the yields are different in practice. Reaction products and reflected ions are present in the structure, and as the aspect ratio increases, exhaust thereof is delayed, and the etching rate tends to decrease. In order to prevent this, it is effective to increase the energy for accelerating ions so as to suppress attenuation due to the reaction products and the reflected ions. In addition, it is also effective to reduce the pressure so as to increase the exhaust speed. The increase in energy for accelerating ions and the reduction in pressure correspond to an increase in $V_0$ and a decrease in P, these changes being in agreement with directivities of the conditions.

From the above-described viewpoints, as the aspect ratio increases, a shift to the condition, in which the sheath length is larger, among the aspects of the present disclosure is desirable. For example, regarding the structure having an aspect ratio of 10, in the case where the sheath length was 5 times the depth of the structure, which was the lower limit of the present disclosure, the etching rate for the substrate surface was about 6 times that for the bottom surface of the structure. Meanwhile, in the case where the sheath length was made to be 10 times the depth of the structure, the etching rate for the substrate surface was reduced to 2 to 3 times that for the bottom surface of the structure. It is considered that the damage to the side wall decreases due to this change. Empirically, it is known that regarding the structure having an aspect ratio of 4 or more, the aspects of the present disclosure can be satisfied at a higher level, and as described above, for example, the region, in which the sheath length is at least 10 times the depth of the structure, is employed.

In this regard, the aspect ratio of a simple rectangular cross-sectional pattern, as shown in FIG. 1, is easily calculated. However, a complicated structure may be employed in practice. Even when the aspect ratios are equal, the results of a hole-like one-dimensional pattern and a trench-like two-dimensional pattern are not always the same. In the present disclosure, for the purpose of generalization, a hole and a trench having the same aspect ratio are assumed to be the same, and the aspect ratio R is defined by the following formula, where an opening width at a depth of m is specified as A (m). The opening width refers to the width in the short-hand direction.

$$R = \int_0^L \frac{dm}{A(m)} \qquad (8)$$

As described above, in the case where the condition in the range satisfying the following requirements
(1) the sheath length is at least 5 times or at least 10 times the depth of the structure, and
(2) the mean free path is more than or equal to the sheath length
is set, it is possible to remove the protective film on the bottom surface of a structure even having a depth of 200 µm or more or 300 µm or more with substantially no damage to the protective film on the side wall.

First Embodiment

Figure 3A:
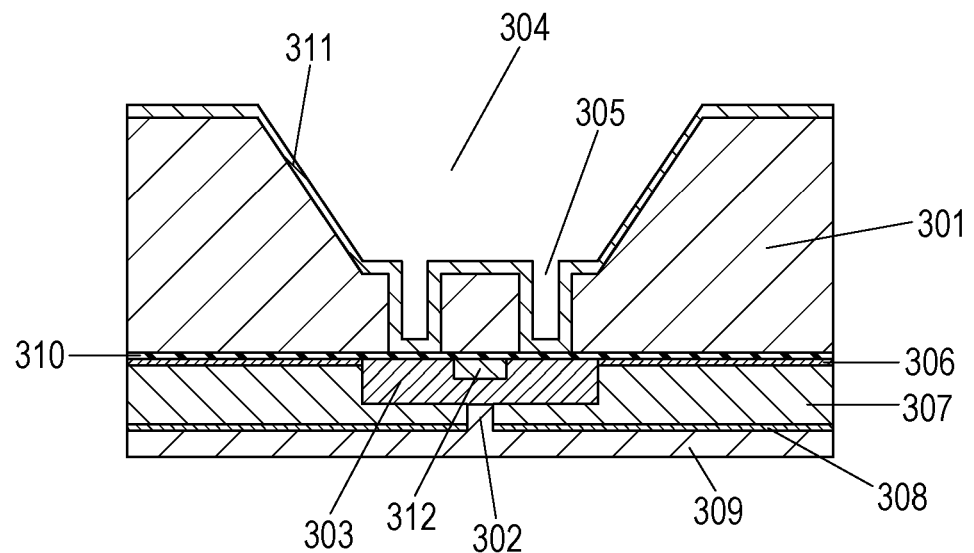
FIGS. 3A and 3B are sectional views illustrating steps of a first embodiment.

A method for processing a silicon substrate for a liquid ejection head will be described as a first embodiment. In the following embodiment, an example of the method for processing a silicon substrate for a liquid ejection head is shown but the present invention is not limited to this. A structure shown in FIG. 3A is an appropriate example of the present embodiment. This is a liquid ejection head in which a supply port 305 substantially perpendicular to the bottom surface of a common liquid chamber 304 formed by crystal anisotropic etching is disposed. The supply port 305 is formed by dry etching, e.g., a Bosch process. The substantially perpendicular supply port has low resistance to, in particular, an alkaline liquid and, therefore, a protective film 311 has to be formed.

A material expected to have alkali resistance is suitable for the protective film. Examples thereof include oxides, e.g., $SiO_2$, $Al_2O_3$, $Ta_2O_5$, $ZrO$, $TiO_2$, and $HfO_2$. An atomic layer deposition (ALD) method is a method for forming a protective film composed of any one of these materials so as to have substantially the same thickness everywhere in a structure having a high aspect ratio or a complicated structure. This is a method for forming atomic layers (or molecular layers) one after another by alternately introducing molecules containing atoms serving as a raw material and molecules containing oxygen atoms for oxidizing the atoms, and film formation proceeds due to a reaction of precursor material molecules adhering to the substrate surface because of thermal energy given to the substrate. Therefore, it is an advantage that the film thickness hardly changes with direction and depth.

These materials are not only resistant to alkalis but also suitable for a process for removing a protective film on the bottom surface. These are oxides and, therefore, the rate of etching by a chemical reaction is low. As a result, ion bombardment is used for the etching. Consequently, the protective film on the bottom surface is relatively easily selectively removed with respect to the protective film on the side wall by the method according to the present disclosure as long as traces of ions are controlled.

For example, $Ta_2O_5$ is selected as the material for forming the protective film, and the film thickness is set to be 100 nm. This film thickness is usually sufficient for providing protection from alkalis. However, part of the film structure of the protective film of the side wall is destroyed due to ion bombardment depending on the condition of removal of the protective film on the bottom surface and the alkali components pass through the protective film. Consequently, silicon just below the film may be dissolved, the entire film may peel from the side wall of the structure and, thereby, the performance of protection from alkalis and the like may disappear.

Figure 8:
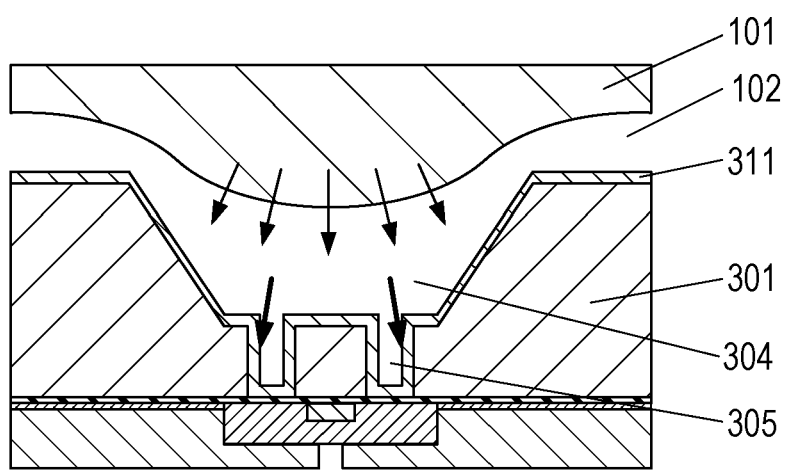
FIG. 8 is a schematic diagram illustrating a plasma molding effect.

The depth of the common liquid chamber 304 of the present structure is, for example, 300 to 600 µm, and the depth of the supply port 305 is, for example, about 50 to 300 µm. The total depth of the common liquid chamber and the supply port corresponds to the thickness of the substrate 301. That is, the structure penetrates the substrate, and a protective insulating film 310 serving as an etching stop layer is exposed at the bottom surface. The opening width of the common liquid chamber is about 500 to 1,200 µm, and the opening width of the supply port is about 20 to 50 µm. The depth only of the supply port is not so large, but in the case where a large structure, such as the common liquid chamber, is present above, if the sheath length is small, a phenomenon called a plasma molding effect, in which the sheath is formed so as to be bent along the irregularities of the pattern, occurs. Ions are perpendicularly (in the direction indicated by arrows) incident on the deformed sheath surface. Therefore, if etching is performed under the condition of a small sheath length, a situation in which ions collide with an upper side wall close to the side wall of the common liquid chamber among the sidewalls of the substantially perpendicular supply ports is brought about (refer to FIG. 8). Consequently, in this example, when the sheath length is discussed, it is necessary that the depth of the structure includes the depth of the common liquid chamber 304 and the depth of the supply port 305. That is, in the above-described case, the depth is about 350 to 900 µm. Regarding the aspect ratio, for example, the case where the opening width of the supply port is 40 µm, the depth is 150 µm, the opening width of the common liquid chamber is 1,200 µm, and the depth is 500 µm is considered.

The side wall angle due to crystal anisotropic etching of silicon is 54.7°. Therefore, in the case where the opening width is 1,200 µm and the depth is 500 µm, the width of the bottom section results in 492 µm by calculation. Consequently, in the common liquid chamber, $A (m) = -(1200-492)/500 \times m + 1200$, that is, a linear expression with respect to m holds. When the aspect ratio of the common liquid chamber portion is specified as R1, $$R1 = \int_0^{500} \frac{dm}{\frac{-(1200-492)}{500 \times m} + 1200}$$

is derived from formula (8). Substitution of $$X = \frac{-(1200-492)}{500 \times m} + 1200 = \alpha \times m + 1200$$

yields $$R1 = \int_{492}^{1200} \frac{(dX/\alpha)}{X}$$
$$= LN(1200/\alpha) - LN(492/\alpha)$$
$$= LN(1200/492)$$

Calculation of this formula yields 0.89.

The aspect ratio R2 of the supply port portion is $R2 = 150/40 = 3.75$ and, therefore, the sum of the aspect ratios of the two structures is estimated to be 4.64 by calculation. Likewise, in other exemplary embodiments, the aspect ratio of each of the structures is calculated, and the sum of these is calculated as the aspect ratio of the entire structure. In the case where the common liquid chamber is provided with a plurality of supply ports as well, the aspect ratio of one supply port is taken into consideration because the protective film to be removed is located at the bottom surface of each of the supply ports.

Meanwhile, two constituent requirements of "the sheath length is at least 5 times the depth of the structure" and "the mean free path is more than or equal to the sheath length" are considered. In the case where the depth of the structure is at a minimum, that is, 350 µm in the above-described case, under the assumption that the electron temperature (Te)=1.0 eV and the electron density $(n_0)$=5.0E16 $(m^{-3})$, the value of $V_0$ is calculated as 280 V or more from formula (1-1) and formula (1-2). Also, the pressure is calculated as 4.3 Pa or less from formula (5).

In the case where the depth is at maximum, that is, 900 µm, likewise the value of $V_0$ is calculated as 950 V or more and the pressure is calculated as 1.7 Pa or less. As a matter of course, these are minimum requirements, $V_0$ can be increased from this, and the pressure can be reduced so as to realize the mean free path more than or equal to the sheath length at that time.

For example, the case where the depth of the structure is 650 µm (the depth of the common liquid chamber of 500 µm and the depth of the supply port of 150 µm) and the sheath length is 10 times the depth of the structure is considered. Regarding the condition at this time, under the assumption that the sheath length is 6.5 mm, the value of $V_0$ is calculated as 1,550 V or more and the pressure is calculated as 1.2 Pa or less.

For example, the following conditions are set as a process for realizing this.
Etching system: trade name: APS, produced by SPP Technologies Co., Ltd.
ICP excitation power: 200 W
Bias power: 1,000 W
Bias frequency: 13.56 MHz
Pressure: 0.5 Pa
Gas: Ar 100 sccm Under these conditions, $V_0 \geq 1,600$ V was achieved. The sheath length at this time was calculated as about 6.67 mm, and the mean free path at the pressure of 0.5 Pa was roughly calculated as 15.5 mm. Therefore, the two constituent requirements of "the sheath length is at least 10 times the depth of the structure" and "the mean free path is more than or equal to the sheath length" were satisfied.

The following conditions were also suitable.
Etching system: trade name: NE550, produced by ULVAC, Inc.
ICP excitation power: 100 W
Bias power: 550 W
Bias frequency: 600 kHz
Pressure: 0.5 Pa
Gas: Ar 50 sccm Under these conditions, $V_0$ 2,500 V was achieved. The sheath length at this time was calculated as about 9.31 mm, and the mean free path at the pressure of 0.5 Pa was roughly calculated as 15.5 mm. Therefore, the above-described two constituent requirements were satisfied.

A gas system used in etching is not limited to Ar. Etching is performed by using other rare gases, e.g., Xe and Kr, F-based gases, and Cl-based gases. However, an ionization process and a dissociation process of the rare gas are simple and, therefore, the rare gas is suitable for the use in which strict control of the traces of the ions is desired, and Ar is used favorably because an etching yield by sputtering is high and the cost is low.

Figure 3B:
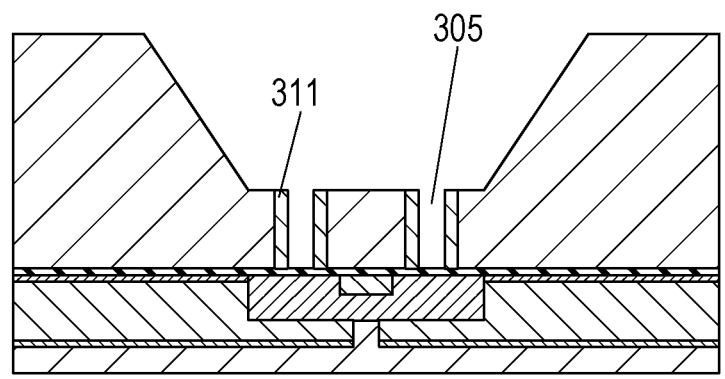

FIG. 3B shows a schematic diagram of a cross section of the liquid ejection head after the present process is performed. A protective film 311 remains on only the substantially perpendicular side wall of the supply port 305, and is substantially removed from the bottom surface and inclined side wall of the common liquid chamber 304, the upper surface of the substrate 301, and the bottom surface of the supply port. The state shown in FIG. 3B satisfies the purpose of the present disclosure because strict dimension control is required for the supply port.

Figure 4A:
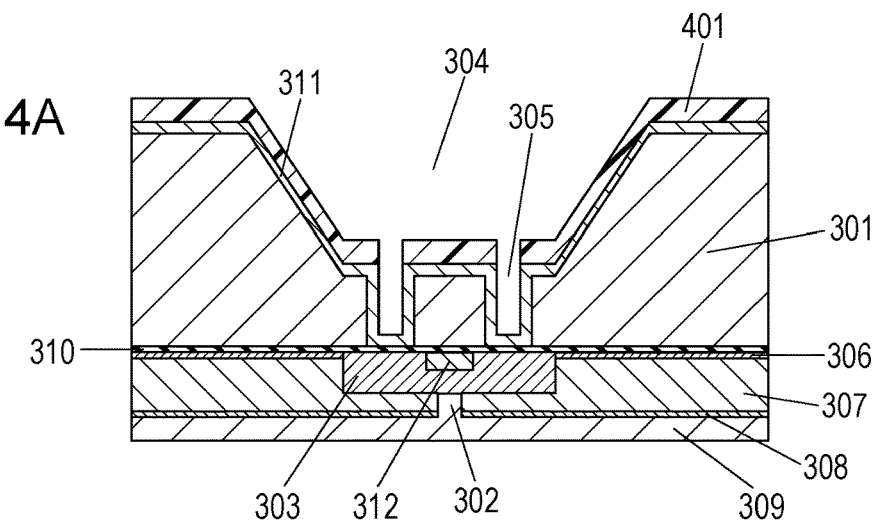
FIGS. 4A to 4C are sectional views illustrating steps of the first embodiment.
Figure 4B:
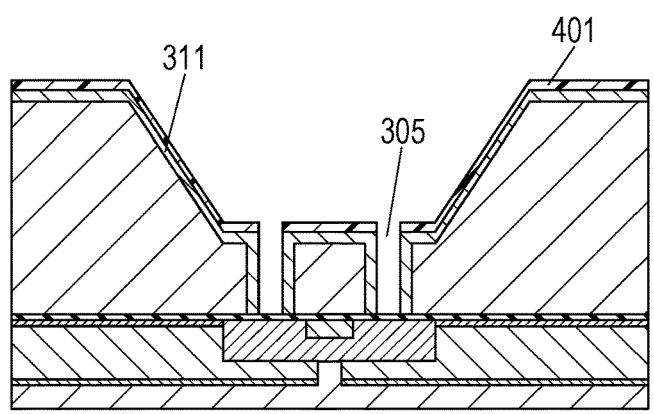
Figure 4C:
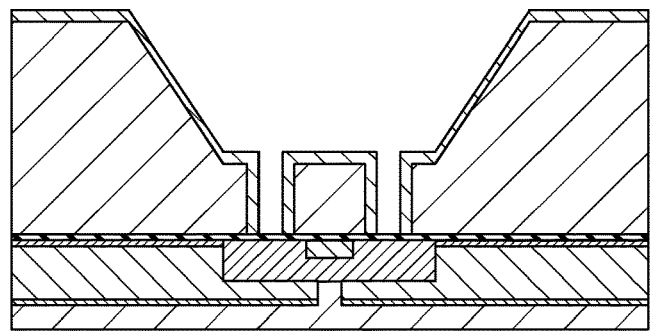

However, in the case where it is desired to retain the protective film on the bottom surface and the inclined side wall of the common liquid chamber, for example, the following process is considered. The inside of the structure is coated with a resist 401 by using a spray coater (FIG. 4A). The substantially perpendicular side wall and the bottom surface of the structure having a high aspect ratio are hardly coated with the resist by using the spry coater. Therefore, a state in which only the upper surface of the substrate and the bottom surface and wall of the common liquid chamber are coated with the resist is brought about. Thereafter, the protective film on the bottom surface of the supply port is removed (FIG. 4B), finally the resist 401 is removed and, thereby, a state in which the protective film 311 remains on the inner wall of the common liquid chamber 304 as well is brought about (FIG. 4C). It is also effective that a short asking step of removing the resist adhering the inner wall of the supply port is performed just to make sure before the protective film on the bottom surface of the supply port is removed.

Second Embodiment

Figure 5:
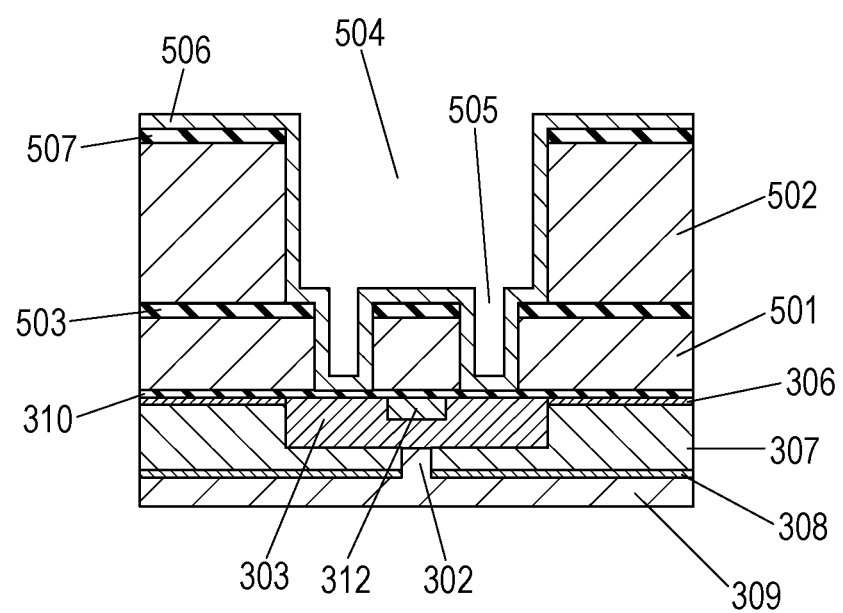
FIG. 5 is a sectional view illustrating a step of a second embodiment.

A structure shown in FIG. 5 is a second embodiment. Regarding both a common liquid chamber 504 and a supply port 505, structures perpendicularly formed by dry etching, e.g., the Bosch process, are provided with a protective film 506.

Figure 6A:
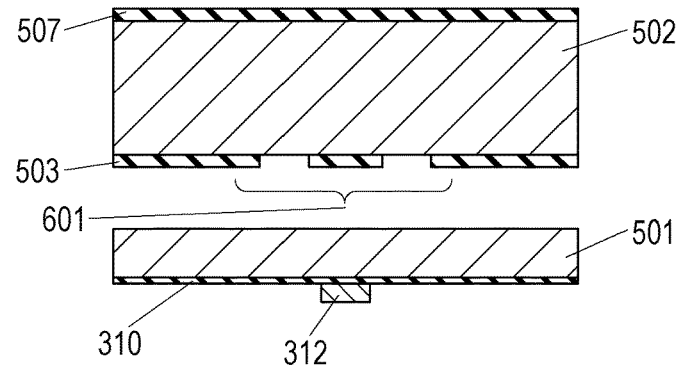
FIGS. 6A to 6H are sectional views illustrating steps of the second embodiment and example 2.
Figure 6B:
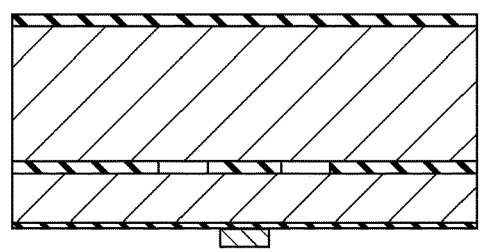

FIGS. 6A to 6H show an example of a production process according to the present embodiment. As shown in FIG. 6A, a first silicon substrate 501 including an ejection energy generation element 312 and a second silicon substrate 502 are prepared. An intermediate layer 503 is formed on at least one surface of the silicon substrate 502, and the intermediate layer 503 is provided with a first pattern shape 601 to be used as a mask for forming the supply port. Then, the two silicon substrates are bonded to each other with the intermediate layer 503 interposed therebetween (FIG. 6B).

Figure 6C:
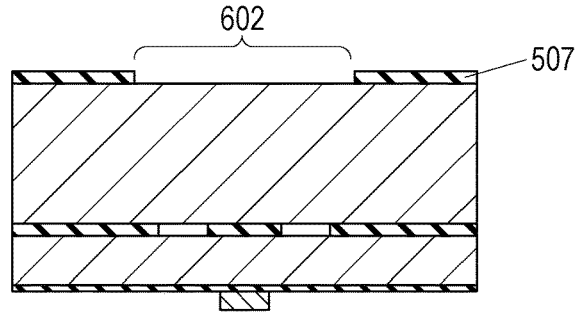

The common liquid chamber 504 and the supply port 505 are formed from the silicon substrate 502 side by dry etching, e.g., the Bosch process. The intermediate layer 503 functions as a stopper when the common liquid chamber 504 is etched (FIG. 6E) and functions as a mask when the supply port 505 is etched (FIG. 6F). Subsequently, the protective film 506 is formed (FIG. 6G). The process for forming the protective film is the same as that in the first embodiment. Then, the protective film on the bottom surface of the supply port 505 is removed. FIG. 6H shows a schematic diagram of a cross section of the liquid ejection head after the present process is performed.

The depth of the common liquid chamber of the present structure is, for example, 300 to 600 µm, and the depth of the supply port is, for example, about 50 to 300 µm. The opening width of the common liquid chamber is about 50 to 500 µm, and the opening width of the supply port is about 10 to 40 µm. The depth of the structure is equal to that in the first embodiment and, therefore, it is considered that the range of the etching condition for removing the bottom surface protective film is also equal. In the case where, for example, the opening width of the supply port is 40 μm, the depth is 150 μm, the opening width of the common liquid chamber is 500 μm, and the depth is 500 μm, the aspect ratio is estimated to be 4.75 from formula (8).

In the present embodiment, in contrast to the first embodiment, the common liquid chamber is also perpendicular and, therefore, the protective film 506 on the side wall remains after etching of the protective film on the bottom surface of the supply port. In the case where, for example, a thermally oxidized film or the like having high alkali resistance is used as the intermediate layer 503, it is possible to retain, by adjusting the film thickness, the intermediate layer on the bottom surface of the common liquid chamber after etching of the bottom surface protective film. Consequently, a state, in which the entire silicon surface in the common liquid chamber is protected, is brought about.

Exemplary Embodiments

The present disclosure will be specifically described below with reference to the exemplary embodiments. However, the present invention is not limited to these exemplary embodiments.

Example 1

Figure 7A:
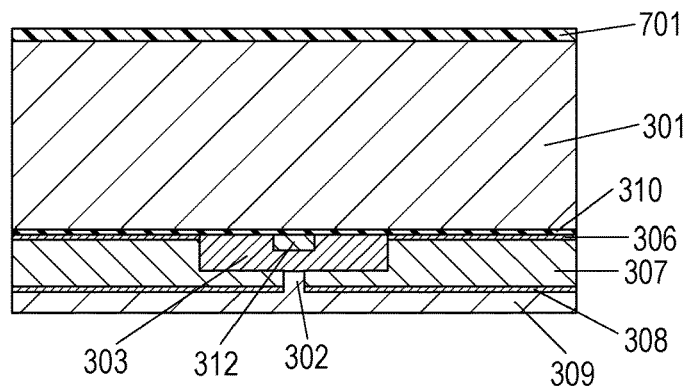
FIGS. 7A to 7H are sectional views illustrating steps of example 1.

In an example according to the first embodiment, a liquid ejection head was produced by a method for manufacturing a liquid ejection head shown in FIGS. 7A to 7H. A head substrate 301 having a surface that was a (100) plane was prepared. The substrate 301 was provided with a protective insulating film 310 composed of a silicon oxide film on the surface, an ejection energy generation element 312, a flow passage structure 303, an ejection port 302 formed by using a flow passage forming member 307, and a liquid-repellent layer 308 (FIG. 7A). The thickness of the head substrate 301 was set to be 625 μm.

The entire surface of the liquid-repellent layer 308 was coated with OBC (trade name, produced by TOKYO OHKA KOGYO CO., LTD.) as a surface protective layer 309. An etching-resistant film 701 composed of a polyetheramide resin (HIMAL (trade name) produced by Hitachi Chemical Company, Ltd.) was formed on the back surface of the head substrate 301.

Figure 7B:
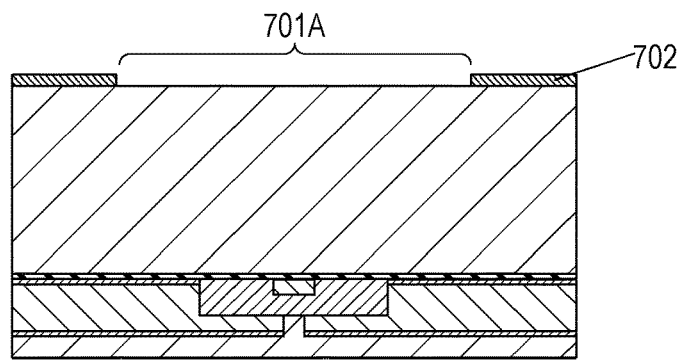

The entire surface of the etching-resistant film 701 was coated with a photosensitive positive type resist (OFPR-800 (trade name) produced by TOKYO OHKA KOGYO CO., LTD., not shown in the drawing). The resulting positive type resist was provided with a slit-like supply port pattern by using Deep-UV exposure apparatus UX-3000 (trade name) produced by USHIO INC. A mixed gas of $CF_4$ and $O_2$ was used and the etching-resistant film 701 was provided with a slit-shaped pattern 701A by performing chemical dry etching from above the positive type resist so as to form a first etching mask 702 (FIG. 7B).

Figure 7C:
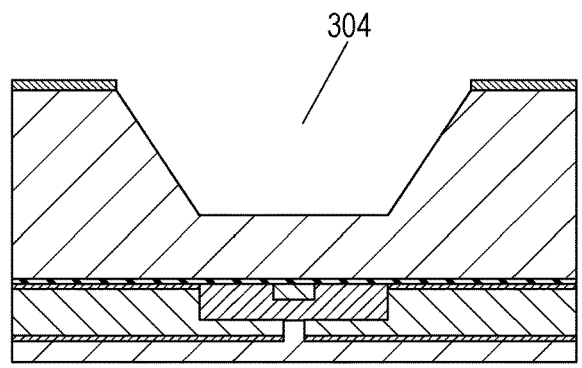

The first etching mask 702 was used as a mask and a silicon substrate was subjected to anisotropic etching by being dipped into a tetramethylammonium hydroxide (TMAH) aqueous solution at 80° C. so as to form a common liquid chamber 304 (FIG. 7C). The opening width of the common liquid chamber 304 was set to be 1,200 μm. Regarding the anisotropic etching, the etching rate was calculated such that the depth of the common liquid chamber 304 to be formed became 475 μm, and dipping was performed. The etching mask may be formed in advance when the substrate is prepared. Subsequently, the first etching mask 702 was removed.

A layer of a photosensitive positive type resist 703 was formed, by using a spray coater (produced by EV Group), on the surface subjected to the anisotropic etching. The photosensitive positive type resist was AZ-P4620 (trade name, produced by AZ Electronic Materials). An inclined portion and an edge portion were uniformly coated by performing coating while substrate chuck was heated so as to maintain the substrate at 60° C. during spray coating.

Figure 7D:
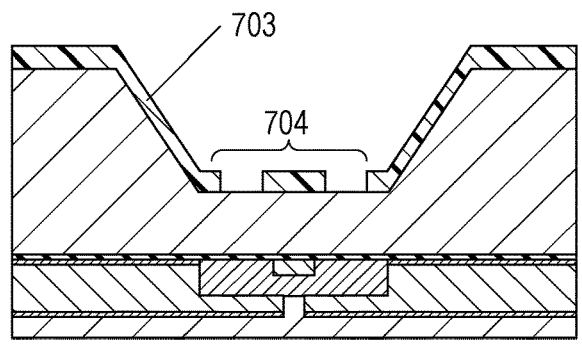

The photosensitive positive type resist 703 was subjected to exposure through a mask provided with a supply port pattern at an exposure dose of 1,000 $mJ/cm^2$ by using a projection aligner UX-4023 (trade name) produced by USHIO INC. At this time, the place to be exposed was the bottom section of the common liquid chamber formed in advance by the anisotropic etching and, therefore, the position of the exposure focal point was lowered by the depth of the above-described anisotropic etching. Then, development was performed by using a 2.38% TMAH aqueous solution so as to form a second etching mask provided with an opening 704 of the pattern of a fine supply port (FIG. 7D). The opening width of the pattern was set to be 40 μm.

Figure 7E:
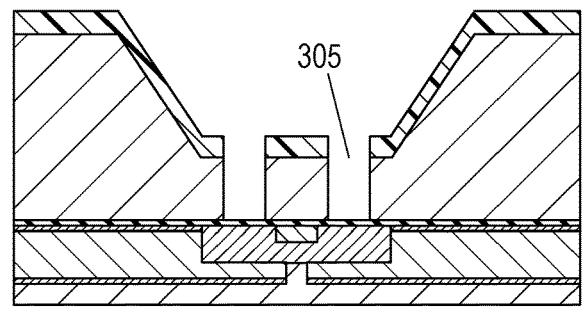

Etching of the substrate 301 was performed from above the second etching mask up to the protective insulating film 310 serving as an upper surface etching stop layer by employing the Bosch process using Pegasus (trade name, produced by SPP Technologies Co., Ltd.) so as to form a supply port 305 (FIG. 7E).

Figure 7F:
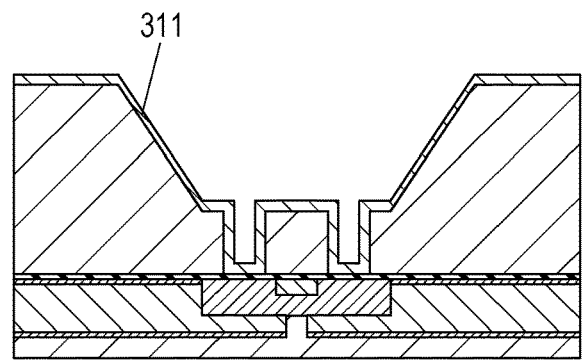
Figure 7G:
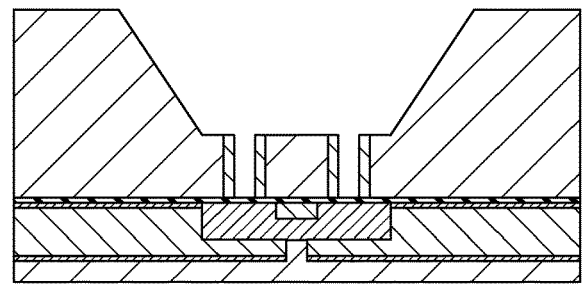

The photosensitive positive type resist used as the second etching mask was removed by asking with oxygen plasma, and a protective film 311 composed of $Ta_2O_5$ was formed by using an ALD apparatus (produced by Picosun) (FIG. 7F). Subsequently, the protective film 311 on the bottom surface of the supply port was removed by using ICP etching system APS (trade name, produced by SPP Technologies Co., Ltd.) (FIG. 7G).

Figure 7H:
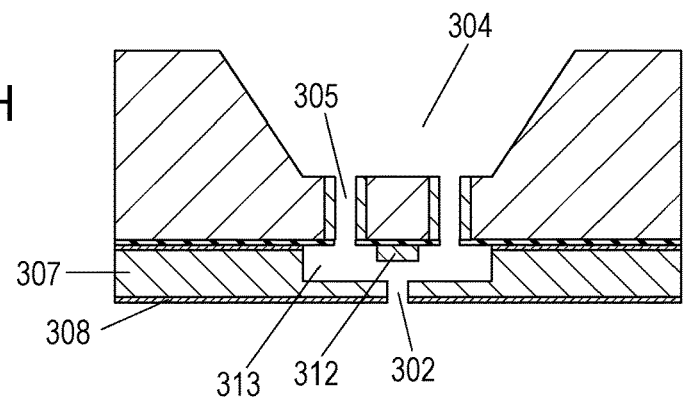

The protective insulating film 310 serving as the etching stop layer was removed by wet etching with buffered hydrofluoric acid 110U (trade name, produced by Daikin Industries, Ltd.). Subsequently, OBC (trade name) serving as the surface protective layer 309 was removed with xylene. Thereafter, the entire surface was subjected to exposure from above the liquid-repellent layer 308 at an exposure dose of 7,000 $mJ/cm^2$ by using Deep-UV exposure apparatus UX-3000 (trade name) produced by USHIO INC., so as to solubilize the flow passage structure 303 for forming a liquid flow passage pattern. The flow passage structure 303 was removed by being dipped into methyl lactate while applying ultrasonic waves so as to form the liquid flow passage 313 in the flow passage forming member 307. The liquid flow passage 313 communicated with the ejection port 302. The supply port 305 communicated with the liquid flow passage 313. A liquid supplied from the supply port 305 passed through the liquid flow passage 313. A liquid ejection head according to the first embodiment was produced by the above-described process (FIG. 7H). The liquid in the liquid flow passage (pressure chamber) 313 may be circulated between the inside and the outside of the pressure chamber. For example, in the liquid ejection head shown in FIG. 7H, two supply ports were opened to the liquid flow passage 313. However, the liquid may be supplied to the liquid flow passage 313 from outside the liquid ejection head through one liquid supply port and thereafter the liquid may return to the outside through the other liquid supply port.

The conditions used in the present example will be organized. The etching conditions for removing the protective film on the bottom surface were as described below.
ICP excitation power: 200 W
Bias power: 1,000 W
Bias frequency: 13.56 MHz
Pressure: 0.5 Pa
Gas: Ar 100 sccm In the present condition, $V_0$ was 1,600 V, and the sheath length was calculated as about 6.67 mm. Meanwhile, the depth of the structure corresponded to the thickness of the substrate 301 of 625 μm. The sheath length was about 10 times the depth of the structure. The mean free path was roughly calculated as 15.5 mm from the pressure of 0.5 Pa. This was about 2.3 times the sheath length. The aspect ratio calculated on the basis of formula (8) by using the opening width of the common liquid chamber of 1,200 μm and the opening width of the supply port of 40 μm was 4.57.

Example 2

In an example according to a second embodiment, a liquid ejection head was produced by a method for manufacturing a liquid ejection head shown in FIGS. 6A to 6H.

The thickness of a first silicon substrate 501 provided with a protective insulating film 310 and an ejection energy generation element 312 on one surface was reduced to 150 μm by performing back grinding from the other surface. Thereafter, grinding was performed by CMP so as to obtain a mirror surface having a surface roughness of 1 nm or less.

A second silicon substrate 502 which had a thickness of 500 μm and which was provided with silicon oxide films of 1.0 μm on both surfaces by performing thermal oxidation was prepared. The silicon oxide film on the bonding surface side was specified as an intermediate layer 503 and the silicon oxide film on the opposite side was specified as a back surface protective layer 507. The surface of the intermediate layer 503 on the bonding surface side was coated with a photosensitive positive type resist (OFPR-PR8-PM (trade name) produced by TOKYO OHKA KOGYO CO., LTD., not shown in the drawing). The resulting positive type resist was subjected to exposure by using Deep-UV exposure apparatus UX-4258 (trade name) produced by USHIO INC., and to development so as to be processed into a first pattern shape. The silicon oxide film serving as the intermediate layer 503 was subjected to wet etching with buffered hydrofluoric acid 110U (trade name, produced by Daikin Industries, Ltd.) so as to form a mask pattern 601 for forming a supply port (FIG. 6A). The opening width was set to be 40 μm. A remaining positive type resist was removed.

The bonding surface of the first silicon substrate 501 and the bonding surface of the intermediate layer 503 formed on the second silicon substrate 502 were activated with $N_2$ plasma by using a plasma activation apparatus (trade name: EVG810LT) produced by EVG. Thereafter, registration was performed by using an aligner (trade name: EVG6200BA) produced by EVG. Then, the first silicon substrate 501 and the second silicon substrate 502 were bonded to each other by fusion bonding with the intermediate layer 503 having the first pattern shape interposed therebetween by using a bonding apparatus (trade name: EVG520IS) produced by EVG (FIG. 6B).

The surface of the back surface protective layer 507 on the side opposite to the bonding surface of the second silicon substrate 502 was coated with the photosensitive positive type resist (OFPR-PR8-PM (trade name) produced by TOKYO OHKA KOGYO CO., LTD., not shown in the drawing). The resulting positive type resist was subjected to exposure by using Deep-UV exposure apparatus UX-4258 (trade name) produced by USHIO INC., and to development. Subsequently, the back surface protective layer 507 was subjected to wet etching with buffered hydrofluoric acid 110U (trade name, produced by Daikin Industries, Ltd.) so as to form a mask pattern 602 for forming a common liquid chamber (FIG. 6C). The opening width was set to be 100 μm.

Figure 6D:
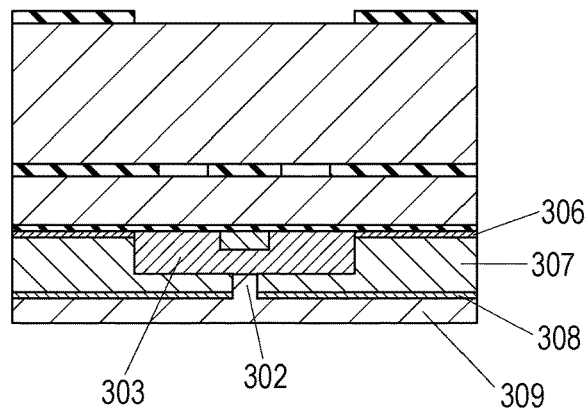

A structure constituting a liquid ejection nozzle was formed on the surface opposite to the bonding surface of the first silicon substrate 501 (FIG. 6D). Formation of from a flow passage structure 303 to a surface protective layer 309 was performed in the same manner as that in example 1.

Figure 6E:
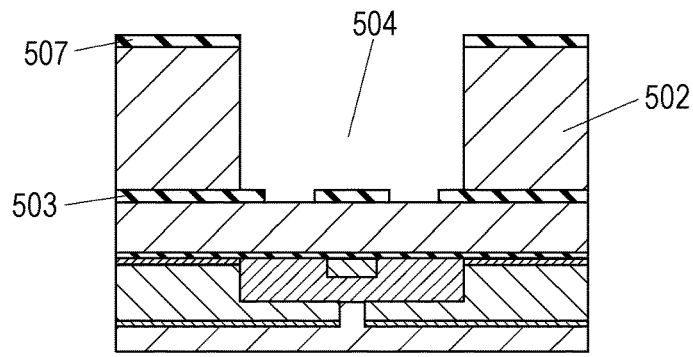
Figure 6F:
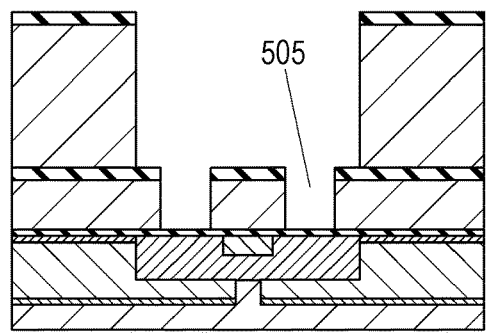
Figure 6G:
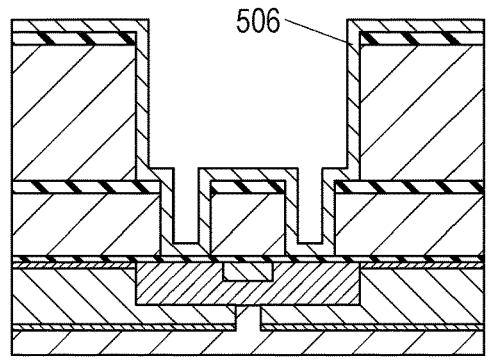
Figure 6H:
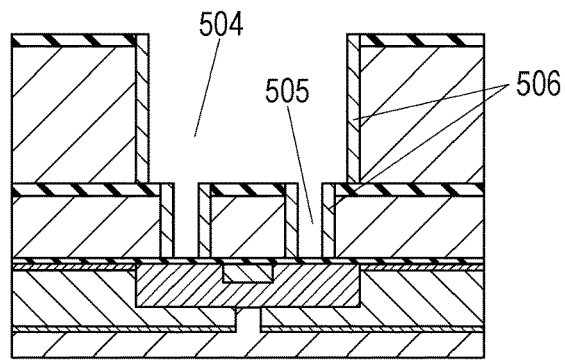

Etching of the second silicon substrate 502 corresponding to the opening portion of the mask pattern 602 was performed by employing the Bosch process using Pegasus (trade name, produced by SPP Technologies Co., Ltd.) so as to form a common liquid chamber 504 (FIG. 6E). Subsequently, etching of the first silicon substrate 501 corresponding to the opening portion of the mask pattern 601 of the intermediate layer 503 was performed by using the same etching system so as to form a supply port 505 (FIG. 6F).

A protective film 506 composed of $Ta_2O_5$ was formed by using the ALD apparatus (produced by Picosun) (FIG. 6G). Subsequently, the protective film 506 on the bottom surface of the supply port 505 was removed by using NE550 (trade name, produced by ULVAC, Inc.) (FIG. 6H). Thereafter, removal of the protective insulating film 310 serving as the etching stop layer, removal of the surface protective layer 309, and removal of the flow passage structure 303 were performed in the same manner as that in example 1. A liquid ejection head according to the second embodiment was produced by the above-described process.

The conditions used in the present example will be organized. The etching conditions for removing the protective film on the bottom surface were as described below.
ICP excitation power: 100 W
Bias power: 550 W
Bias frequency: 600 kHz
Pressure: 0.5 Pa
Gas: Ar 50 sccm In the present condition, $V_0$ was 2,500 V, and the sheath length was calculated as about 9.31 mm. Meanwhile, the depth of the structure was 650 μm in total of 500 μm of the common liquid chamber and 150 μm of the supply port. Therefore, the sheath length was about 14 times the depth of the structure. The mean free path was roughly calculated as 15.5 mm from the pressure of 0.5 Pa. This was about 1.7 times the sheath length. The aspect ratio calculated by using the opening width of the common liquid chamber of 100 μm and the opening width of the supply port of 40 μm was 8.75.

Up to this point, the method for processing the silicon substrate for the liquid ejection head has been described. However, the present invention is not limited to this. For example, the present disclosure may be applied to production of the through silicon via (TSV) and other MEMS devices, which are considered in the semiconductor production process.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-059813 filed Mar. 24, 2016, which is hereby incorporated by reference herein in its entirety.

What is claimed is:

1. A method for processing a silicon substrate comprising:
forming a structure having a depth of 200 μm or more from a first surface of a silicon substrate, a side wall, and a bottom surface, at least a part of the side wall being substantially perpendicular to the first surface;
forming a protective film on an inner wall of the structure, the inner wall comprising the side wall and the bottom surface; and
performing plasma etching so as to selectively remove the protective film disposed on the bottom surface of the structure with respect to the protective film disposed on the substantially perpendicular side wall of the structure,
wherein the plasma etching is performed under the condition in which plasma with a sheath length at least 10 times the depth of the structure is generated and a mean free path of ions generated in the plasma is equal to or longer than the sheath length.

2. The method for processing a silicon substrate according to claim 1, wherein the silicon substrate has a surface that is a (100) plane, and at least a part of the side wall, from the bottom surface in the depth direction, of the structure is substantially perpendicular to the first surface.

3. The method for processing a silicon substrate according to claim 1, wherein the aspect ratio of the structure is 4 or more.

4. The method for processing a silicon substrate according to claim 1, wherein the depth of the structure is 500 μm or more.

5. The method for processing a silicon substrate according to claim 4, wherein the structure penetrates the silicon substrate from the first surface to a second surface opposite to the first surface and the bottom surface of the structure is an etching stop layer disposed on the second surface of the silicon substrate.

6. The method for processing a silicon substrate according to claim 1, wherein an inductively coupled plasma (ICP) etching system is used in the plasma etching.

7. The method for processing a silicon substrate according to claim 1, wherein the plasma etching is performed by rare gas ion bombardment.

8. The method for processing a silicon substrate according to claim 1, wherein the protective film is formed by an atomic layer deposition (ALD) method.

9. The method for processing a silicon substrate according to claim 1, wherein the protective film is composed of any one of $SiO_2$, $Al_2O_3$, $Ta_2O_5$, ZrO, $TiO_2$, and $HfO_2$.

10. A method for processing a silicon substrate comprising:
forming a structure having a depth of 300 μm or more from a first surface of a silicon substrate, a side wall, and a bottom surface, at least a part of the side wall being substantially perpendicular to the first surface;
forming a protective film on an inner wall of the structure, the inner wall comprising the side wall and the bottom surface; and
performing plasma etching so as to selectively remove the protective film disposed on the bottom surface of the structure with respect to the protective film disposed on the substantially perpendicular side wall of the structure,
wherein the plasma etching is performed under the condition in which plasma with a sheath length at least 5 times the depth of the structure is generated and a mean free path of ions generated in the plasma is equal to or longer than the sheath length.

11. The method for processing a silicon substrate according to claim 10, wherein the silicon substrate has a surface that is a (100) plane, and at least a part of the side wall, from the bottom surface in the depth direction, of the structure is substantially perpendicular to the first surface.

12. The method for processing a silicon substrate according to claim 10, wherein the aspect ratio of the structure is 4 or more.

13. The method for processing a silicon substrate according to claim 10, wherein the depth of the structure is 500 μm or more.

14. The method for processing a silicon substrate according to claim 13, wherein the structure penetrates the silicon substrate from the first surface to a second surface opposite to the first surface and the bottom surface of the structure is an etching stop layer disposed on the second surface of the silicon substrate.

15. The method for processing a silicon substrate according to claim 10, wherein an inductively coupled plasma (ICP) etching system is used in the plasma etching.

16. The method for processing a silicon substrate according to claim 10, wherein the plasma etching is performed by rare gas ion bombardment.

17. The method for processing a silicon substrate according to claim 10, wherein the protective film is formed by an atomic layer deposition (ALD) method.

18. The method for processing a silicon substrate according to claim 10, wherein the protective film is composed of a material selected from the group consisting of $SiO_2$, $Al_2O_3$, $Ta_2O_5$, ZrO, $TiO_2$, and $HfO_2$.

19. A method for manufacturing a liquid ejection head comprising the method for processing a silicon substrate according to claim 1, further comprising forming, on a second surface opposite to the first surface of the silicon substrate, a flow passage forming member constituting an ejection port for ejecting a liquid and a liquid flow passage that communicates with the ejection port,
wherein the structure includes a common liquid chamber composed of the first surface of the silicon substrate and a supply port that communicates with the common liquid chamber and the liquid flow passage from a bottom section of the common liquid chamber.

20. The method for manufacturing a liquid ejection head according to claim 19, wherein the silicon substrate has a surface that is a (100) plane, and at least a part of the side wall, from the bottom surface in the depth direction, of the structure is substantially perpendicular to the first surface.

* * * * *